(12) United States Patent
Schneegans et al.

(10) Patent No.: US 10,651,140 B2
(45) Date of Patent: May 12, 2020

(54) SEMICONDUCTOR DEVICE WITH METAL STRUCTURE ELECTRICALLY CONNECTED TO A CONDUCTIVE STRUCTURE

(71) Applicant: Infineon Technologies AG, Neubiberg (DE)

(72) Inventors: Manfred Schneegans, Vaterstetten (DE); Franziska Haering, Regensburg (DE); Hans-Joachim Schulze, Taufkirchen (DE); Bernhard Weidgans, Bernhardswald (DE)

(73) Assignee: Infineon Technologies AG, Neubiberg (DE)

( * ) Notice: Subject to any disclaimer, the term of this patent is extended or adjusted under 35 U.S.C. 154(b) by 36 days.

(21) Appl. No.: 16/101,114

(22) Filed: Aug. 10, 2018

(65) Prior Publication Data

US 2018/0350761 A1 Dec. 6, 2018

Related U.S. Application Data

(63) Continuation of application No. 15/191,777, filed on Jun. 24, 2016, now Pat. No. 10,090,265.

(30) Foreign Application Priority Data

Jun. 29, 2015 (DE) .................... 10 2015 110 437

(51) Int. Cl.
*H01L 21/44* (2006.01)
*H01L 23/00* (2006.01)
(Continued)

(52) U.S. Cl.
CPC ........ *H01L 24/05* (2013.01); *H01L 21/76843* (2013.01); *H01L 21/76858* (2013.01);
(Continued)

(58) Field of Classification Search
CPC ............... H01L 24/05; H01L 21/76843; H01L 21/76858; H01L 23/53223; H01L 23/53238; H01L 29/407
(Continued)

(56) References Cited

U.S. PATENT DOCUMENTS 5,565,707 A 10/1996 Colgan et al.
5,925,933 A 7/1999 Colgan et al.
(Continued)

FOREIGN PATENT DOCUMENTS

DE 102004024644 A1 12/2005
DE 102014108309 A1 12/2014

*Primary Examiner* — Nitin Parekh
(74) *Attorney, Agent, or Firm* — Slater Matsil, LLP

(57) ABSTRACT

A method of manufacturing a semiconductor device includes forming a semiconductor substrate that has a conductive structure, and forming a precursor auxiliary layer stack on a first section of the conductive structure. The precursor auxiliary layer stack has a precursor adhesion layer and a precursor barrier layer between the precursor adhesion layer and the conductive structure. The precursor adhesion layer contains a second metal. The method further includes forming, on the precursor auxiliary layer stack, a metal structure containing a first metal and forming, from portions of the precursor auxiliary layer stack an adhesive layer containing the first and second metals.

20 Claims, 13 Drawing Sheets

(51) Int. Cl.

| | | |
|---|---|---|
| *H01L 29/417* | (2006.01) | |
| *H01L 29/40* | (2006.01) | |
| *H01L 23/532* | (2006.01) | |
| *H01L 29/423* | (2006.01) | |
| *H01L 29/45* | (2006.01) | |
| *H01L 29/66* | (2006.01) | |
| *H01L 29/739* | (2006.01) | |
| *H01L 21/768* | (2006.01) | |

(52) U.S. Cl.
CPC .. *H01L 23/53223* (2013.01); *H01L 23/53238* (2013.01); *H01L 23/53252* (2013.01); *H01L 24/03* (2013.01); *H01L 29/407* (2013.01); *H01L 29/417* (2013.01); *H01L 29/41741* (2013.01); *H01L 29/42376* (2013.01); *H01L 29/45* (2013.01); *H01L 29/6634* (2013.01); *H01L 29/66348* (2013.01); *H01L 29/7396* (2013.01); *H01L 29/7397* (2013.01); *H01L 2224/0345* (2013.01); *H01L 2224/03462* (2013.01); *H01L 2224/03848* (2013.01); *H01L 2224/03912* (2013.01); *H01L 2224/05022* (2013.01); *H01L 2224/05027* (2013.01); *H01L 2224/05166* (2013.01); *H01L 2224/05181* (2013.01); *H01L 2224/05186* (2013.01); *H01L 2224/05572* (2013.01); *H01L 2224/05582* (2013.01); *H01L 2224/05583* (2013.01); *H01L 2224/05611* (2013.01); *H01L 2224/05616* (2013.01); *H01L 2224/05618* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05666* (2013.01); *H01L 2924/13055* (2013.01); *H01L 2924/13091* (2013.01); *H01L 2924/3512* (2013.01)

(58) Field of Classification Search
USPC .......................................... 257/737; 438/614
See application file for complete search history.

(56) References Cited

U.S. PATENT DOCUMENTS

| | | | |
|---|---|---|---|
| 6,451,681 | B1 | 9/2002 | Greer |
| 6,522,013 | B1 * | 2/2003 | Chen ................ H01L 21/76805 |
| | | | 257/751 |
| 7,727,853 | B2 * | 6/2010 | Takeishi ................ G03F 9/708 |
| | | | 438/401 |
| 8,395,261 | B2 | 3/2013 | Tanaka et al. |
| 8,562,977 | B2 * | 10/2013 | Schimmel ............. C07H 21/04 |
| | | | 424/94.5 |
| 8,592,977 | B2 | 11/2013 | Chou et al. |
| 8,653,668 | B2 * | 2/2014 | Uno ....................... H01L 24/48 |
| | | | 257/734 |
| 8,735,276 | B2 | 5/2014 | Chung et al. |
| 8,803,317 | B2 | 8/2014 | Arvin et al. |
| 8,816,486 | B2 | 8/2014 | Tsai et al. |
| 2002/0041030 | A1 * | 4/2002 | Kim .................... H01L 21/76843 |
| | | | 257/758 |
| 2002/0121703 | A1 | 9/2002 | Toyoda et al. |
| 2005/0230912 | A1 | 10/2005 | Kirkwood |
| 2006/0071336 | A1 | 4/2006 | Akram |
| 2006/0091541 | A1 | 5/2006 | Bojkov et al. |
| 2008/0042280 | A1 | 2/2008 | Lin et al. |
| 2009/0261472 | A1 | 10/2009 | Bayerer |
| 2011/0101527 | A1 | 5/2011 | Cheng et al. |
| 2014/0027822 | A1 * | 1/2014 | Su ....................... H01L 29/4966 |
| | | | 257/288 |
| 2014/0367773 | A1 | 12/2014 | Poelzl |
| 2015/0228595 | A1 * | 8/2015 | Willeke ............ H01L 21/32139 |
| | | | 438/614 |
| 2015/0303157 | A1 * | 10/2015 | Uzoh ................ H01L 23/49811 |
| | | | 438/614 |

* cited by examiner

SEMICONDUCTOR DEVICE WITH METAL STRUCTURE ELECTRICALLY CONNECTED TO A CONDUCTIVE STRUCTURE

CROSS-REFERENCE TO RELATED APPLICATIONS

This application is a divisional application of U.S. application Ser. No. 15/191,777, filed on Jun. 24, 2016, which claims priority to German Application No. 10 2015 110 437.7, filed on Jun. 29, 2015, which applications are hereby incorporated herein by reference in their entirety.

TECHNICAL FIELD

The present invention relates to a semiconductor device with a metal structure electrically connected to a conductive structure.

BACKGROUND

Metal structures such as power metallization systems of power semiconductor switches are typically formed by electro-chemical metal pattern plating and may form terminals or bonding pads for conductive structures formed in a semiconductor die. A metal diffusion barrier layer prevents metal atoms from diffusing from the metal structure into structures in the semiconductor die.

There is a need for improving metal structures formed on a surface of a semiconductor die.

SUMMARY

According to an embodiment, a semiconductor device includes a semiconductor die including a conductive structure. A metal structure that contains a first metal is electrically connected to the conductive structure, wherein an auxiliary layer stack is sandwiched between the conductive structure and the metal structure. The auxiliary layer stack includes an adhesion layer containing a second metal as well as a metal diffusion barrier layer between the adhesion layer and the conductive structure. The adhesion layer contains the first metal and a second metal.

According to another embodiment a semiconductor device includes a semiconductor die including a conductive structure. A metal structure is electrically connected to the conductive structure and contains a first metal. An auxiliary layer stack is sandwiched between the conductive structure and the metal structure and includes an adhesion layer containing a second metal, a metal diffusion barrier layer between the adhesion layer and the conductive structure, and an auxiliary barrier layer between the adhesion layer and the metal structure.

According to a further embodiment a method of manufacturing a semiconductor device includes forming a semiconductor substrate including a conductive structure A precursor auxiliary layer stack is formed on a first section of the conductive structure, wherein the precursor auxiliary layer stack includes a precursor adhesion layer and a barrier layer between the precursor adhesion layer and the conductive structure and wherein the precursor adhesion layer contains a second metal. On the precursor auxiliary layer stack, a metal structure containing a first metal is formed. From portions of the precursor auxiliary layer stack an adhesion layer is formed that contains the first and second metals.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION OF ILLUSTRATIVE EMBODIMENTS

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1:
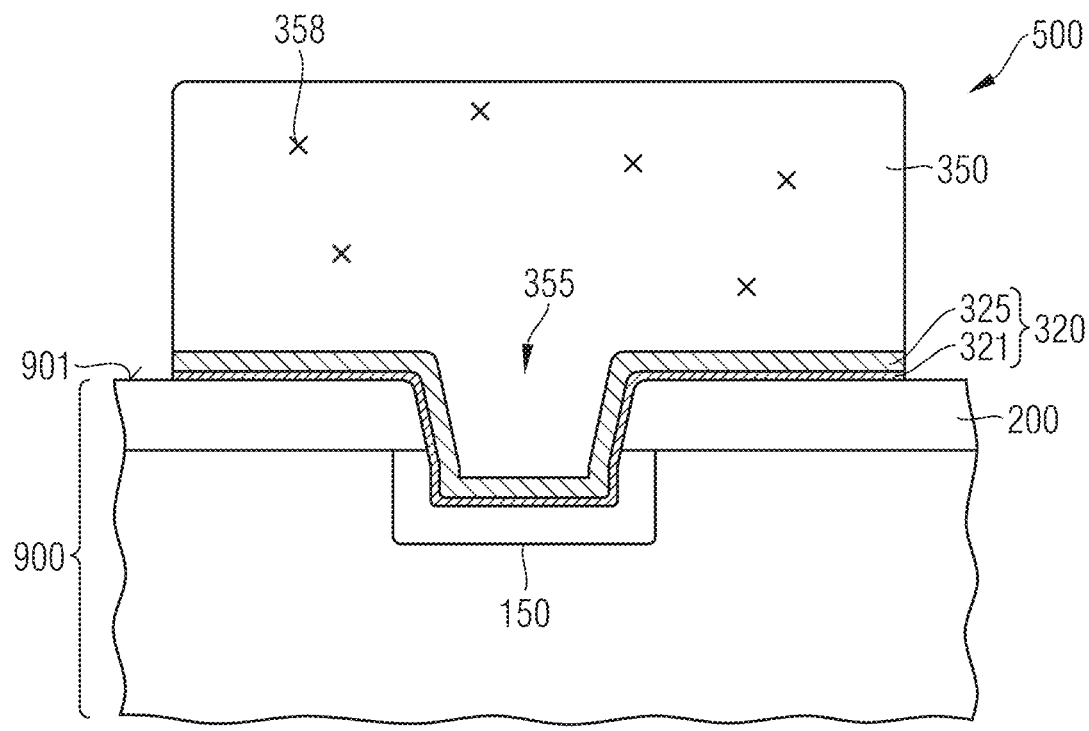
FIG. 1 is a schematic vertical cross-sectional view of a portion of a semiconductor device with an auxiliary layer stack between a metal structure and a conductive structure according to an embodiment.

FIG. 1 shows a semiconductor device 500, which may be a power semiconductor device for switching or rectifying load currents greater 10 mA, for example greater 100 mA, or 1 A, or 10 A, or 100 A. The semiconductor device 500 may be a power semiconductor diode and/or may include transistor cells. For example, the semiconductor device 500 may be or may include an IGFET (insulated gate field effect transistor), for example an MOSFET (metal oxide semiconductor FET) in the usual meaning including FETs with metal gates as well as FETs with non-metal gates, a trench field plate FET, a superjunction FET or a smart FET integrating transistor cells of a power MOSFET and low voltage transistor cells of, e.g., logic and/or driver circuits in CMOS (complementary metal-oxide-semiconductor) technology, an IGBT (insulated gate bipolar transistor), or an MCD (MOS controlled diode).

The semiconductor device 500 includes a semiconductor die 900 including a conductive structure iso, wherein the conductive structure 150 may extend from a main surface 901 into the semiconductor die 900 or may be formed in a distance to the main surface 901 of the semiconductor die 900. The main surface 901 may be at a front side at which wiring layer and transistor cells are formed or opposite to the front side.

For example, the semiconductor die 900 may include a semiconductor portion that includes the conductive structure 150, wherein the conductive structure 150 may be a heavily doped region or another conductive structure from a non-semiconductor material. According to another embodiment, the semiconductor die 900 further includes a dielectric structure on a first surface of the semiconductor portion and a wiring line formed in a wiring plane on a side of the dielectric structure opposite to the semiconductor portion forms the conductive structure 150.

In the illustrated embodiment, the semiconductor die 900 includes a dielectric passivation layer 200 directly along a main surface 901 at the front side of the semiconductor die 900, wherein the main surface 901 of the semiconductor die 900 may be approximately planar or may be defined by a plane spanned by coplanar surface sections. A normal to the main surface 901 defines a vertical direction. Directions parallel to the main surface 901 of the semiconductor die 900 are horizontal directions.

The passivation layer 200 may be a homogeneous layer or may be a layer stack including two or more sublayers of dielectric materials, for example silicon oxide, silicon nitride, silicon oxynitride, silicate glass, e.g., USG (undoped silicate glass), BSG (boron silicate glass), PSG (phosphorus silicate glass), BPSG (boron phosphorus silicate glass), FSG (fluorosilicate glass) or OSG (organosilicate glass), SOG (spin-on-glass) or a dielectric resin, e.g., polyimide.

A metal structure 350 is formed on the main surface 901. The metal structure 350 is part of a final metallization plane, which is the topmost metallization plane above the main surface 901 and which is the outermost metallization plane of the semiconductor device 500. The metal structure 350 may include a contact portion 355 extending through an opening in the passivation layer 200 to or into the conductive structure 150. The metal structure 350 may contain a first metal as main constituent, wherein the main constituent is the constituent with the highest mass fraction. The first metal may be copper (Cu), aluminum (Al), or silver (Ag) and a base material of the metal structure 350 may be silver (Ag), copper (Cu), a copper alloy, aluminum (Al), an aluminum alloy, or a copper-aluminum alloy that may contain further constituents. In addition to the base material, the metal structure 350 may contain further constituents, e.g., atoms 358 of another metal diffused into the base material.

A vertical extension of the metal structure 350 may be at least 500 nm, for example at least 2 μm or at least 5 μm.

An auxiliary layer stack 320 is sandwiched between the metal structure 350 and the semiconductor die 900. A portion of the metal structure 350 extending through the dielectric passivation layer 200 may form a contact portion 355.

The auxiliary layer stack 320 includes at least an adhesion layer 325 and a metal diffusion barrier layer 321 between the adhesion layer 325 and the semiconductor die 900.

The metal diffusion barrier layer 321 is diffusion resistant for atoms of at least the first metal and may also be diffusion resistant to further metal atoms. The metal diffusion barrier layer 321 may be a layer sputtered from tungsten titanium (TiW) or tungsten (W) and titanium (Ti), a titanium layer (Ti), a titanium nitride layer (TiN), a tungsten layer (W), a tantalum nitride layer (TaN), or a tantalum layer (Ta). According to an embodiment the metal diffusion barrier layer 321 is a sputtered layer containing 70 to 95 wt % tungsten (W) and 5 to 30 wt % titanium (Ti).

The adhesion layer 325 contains, as main constituent or as minor constituent with a mass fraction of at least 80 wt % a second metal which is not the first metal. According to an embodiment, the adhesion layer 325 contains pure titanium (Ti), pure aluminum (Al) or an aluminum copper alloy AlxCuy, with x=80 to 99.5% and y=100%-x. The second metal has a greater binding energy to one or more constituents of the metal diffusion barrier layer than the first metal. In addition, the second metal may form an alloy, e.g., a solid solution or an intermetallic phase with the first metal. Further, Young's modulus of the second metal may be lower than Young's modulus of the first metal. For example, Young's modulus of the first metal may exceed Young's modulus of the second metal by at least 20%.

For example, the first metal is copper and the second metal may be aluminum (Al), gold (Au), silver (Ag), tin (Sn), zinc (Zn), lead (Pb) or nickel (Ni). The adhesion layer 325 may contain further constituents, e.g., the first metal and/or at least one further metal selected from aluminum (Al), gold (Au), silver (Ag), tin (Sn), zinc (Zn), lead (Pb) and nickel (Ni). According to an embodiment the first metal is copper (Cu) with Young's modulus of about 120 GPa and the second metal is aluminum (Al) with Young's modulus of about 70 GPa.

Typical power metallization systems include a comparatively thick metallization layer of a power metal, e.g., copper and a diffusion barrier layer prevent the atoms of the power metal from diffusing into the semiconductor die. Binding energy between the power metal and the constituents of the diffusion barrier layer may be low. In addition, the coefficients of thermal expansion of typical metal diffusion barrier layers may strongly deviate from the coefficient of thermal expansion of the power metal. Alternatively or in addition, typical metal diffusion barrier layers provide only pure adhesion to a metal structure from, e.g., copper. As a consequence, cyclic thermal stress generated when repeatedly switching on and off a power switching device tends to locally delaminate the metallization layer from the barrier layer. Sections of the power semiconductor device prone to delamination may locally overheat and the power semiconductor device may be irreversibly damaged.

On contrast, after an appropriate heating treatment an adhesion layer containing at least one second metal different from the first metal and selected from aluminum (Al), gold (Au), silver (Ag), tin (Sn), zinc (Zn), lead (Pb) and nickel (Ni) forms strong bonds at high bonding energy to an underlying metal diffusion barrier layer 321.

In addition, the second metal may solute into the first metal such that the first and second metals form a solid solution of the second metal in the first metal, which acts as solvent. In the solid solution, atoms of the second metal replace atoms of the first metal in the crystal lattice of the first metal or may be interstitially incorporated in the crystal lattice. Alternatively or in addition, the first and second metals may form an intermetallic phase in which atoms of the first and second metals are ordered into different sites of the crystal and in which unit cells containing both metals are formed. For both solid solution and intermetallic phase the interaction between atoms of the first and second metals improves the adhesion of the metal structure 350 on the metal diffusion barrier layer 321.

According to an embodiment, atoms of the second metal diffused into a matrix of atoms of the first metal form an adhesion layer 325 with high bonding energy to both the metal diffusion barrier layer 321 and the metal structure 350 and without that intermetallic phases are formed between the first and second metal.

In the adhesion layer 325 the atoms of the first metal may contribute to a higher bonding energy with atoms of the first metal in the metal structure 350. Atoms of the second metal may have a higher bonding energy with constituents of the metal diffusion barrier layer 321. Alternatively or in addition, the adhesion layer 325 may have a lower Young's modulus than the metal structure 350 and reduces thermomechanical stress between the metal structure 350 and the metal diffusion barrier layer 321. The metal structure 350 may contain up to 10 wt % of the second metal, wherein a concentration of the second metal may decrease with increasing distance to the adhesion layer 325.

According to a further embodiment the second metal does not interact with the first metal and forms an adhesion layer 325 without the first metal but more ductile than the metal structure 350 to relieve thermo-mechanical stress between the metal structure 350 and the metal diffusion barrier layer 321.

The second metal forms strong bonds with at least one of the constituents of the metal diffusion barrier layer 321, which may contain tungsten (W) and titanium (Ti), for example 90 wt % W and 10 wt % Ti. In addition, Young's modulus of the second metal may have be significantly lower than Young's modulus of the first metal such that the adhesion layer 325 is more ductile than the metal structure 350. As a consequence, the adhesion layer 325 may to some degree compensate for the different coefficients of thermal expansion of the metal diffusion barrier layer 321 and the metal structure 350, e.g., in case an auxiliary barrier layer separates the adhesion layer 325 from the metal structure 350. According to other embodiments, e.g., in case no auxiliary barrier layer is formed between the metal structure 350 and the adhesion layer 325, atoms of the second metal may diffuse into the metal structure 350 during an appropriate heating treatment.

The adhesion layer 325 may provide high bonding energy to the metal diffusion barrier layer 321 and/or may reduce thermo-mechanical stress between the metal structure 350 and the metal diffusion barrier layer 321.

Figure 2A:
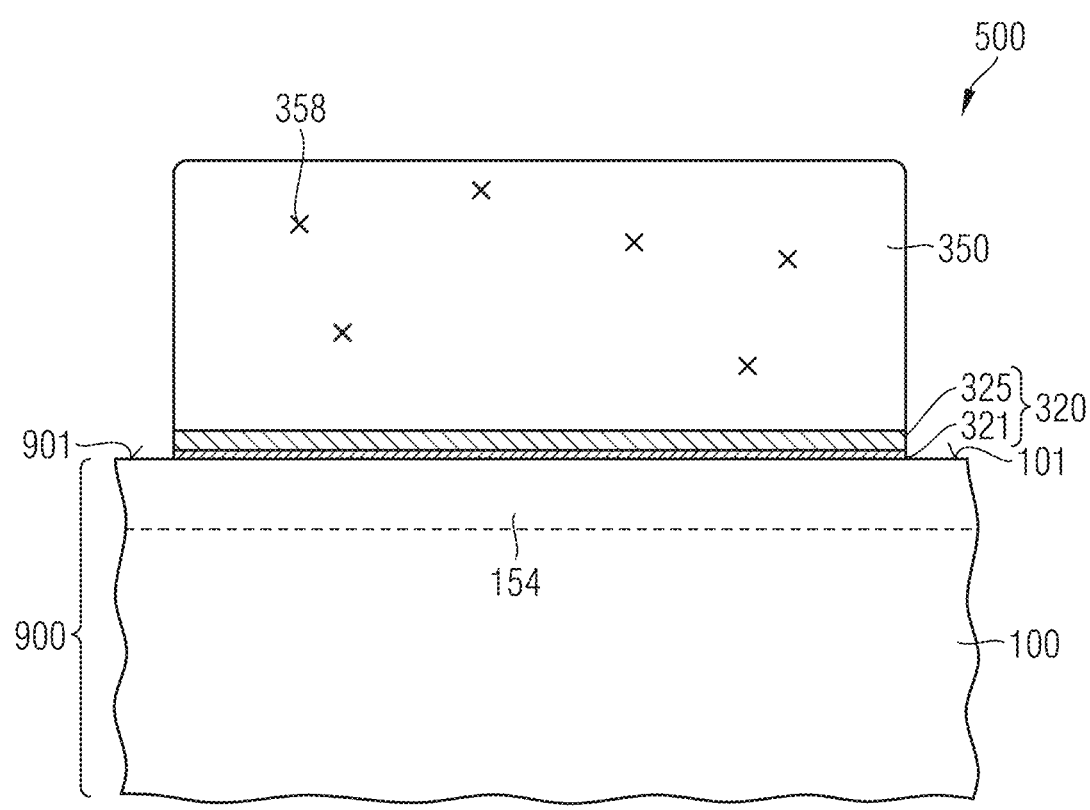
FIG. 2A is a schematic vertical cross-sectional view of a portion of a semiconductor device with an auxiliary layer stack between a metal structure and a conductive structure according to an embodiment with the conductive structure formed in a semiconductor portion.

FIG. 2A refers to semiconductor devices 500 with wide contact areas between a metal structure 350 and a semiconductor portion 100, e.g., power semiconductor diodes. The semiconductor portion 100 includes a doped region 154 that may form, e.g., an anode region. An auxiliary layer stack 320 as described above and including at least a metal diffusion barrier layer 321 and an adhesion layer 325 may be sandwiched between the metal structure 350 and the semiconductor die 900 and may directly adjoin to both the doped region 154 and the metal structure 350. The metal structure 350 may be formed from a first metal, e.g., copper and may include atoms 358 of a second metal, e.g., aluminum originating from the auxiliary layer stack 320, wherein the first and second metals may form an intermetallic phase or a solid solution.

The semiconductor devices 500 of FIGS. 2B to 2E may be power semiconductor switching devices based on semiconductor dies 900 including electronic elements, e.g., diodes or transistor cells TC, which may be planar transistor cells controlling a load current flow parallel to a first surface 101 of a semiconductor portion 100 or vertical transistor cells TC for controlling a load current flow in a vertical direction through the semiconductor portion 100.

The semiconductor portion 100 of the semiconductor die 900 includes one or more doped regions 154, which may be, for example, source zones, body zones or drain zones of the transistor cells TC. The semiconductor die 900 further includes a dielectric structure 210 that covers portions of the first surface 101 of the semiconductor portion 100.

A metal structure 350 on a main surface 901 of the semiconductor die 900 extends through an opening in the dielectric structure 210.

Figure 2B:
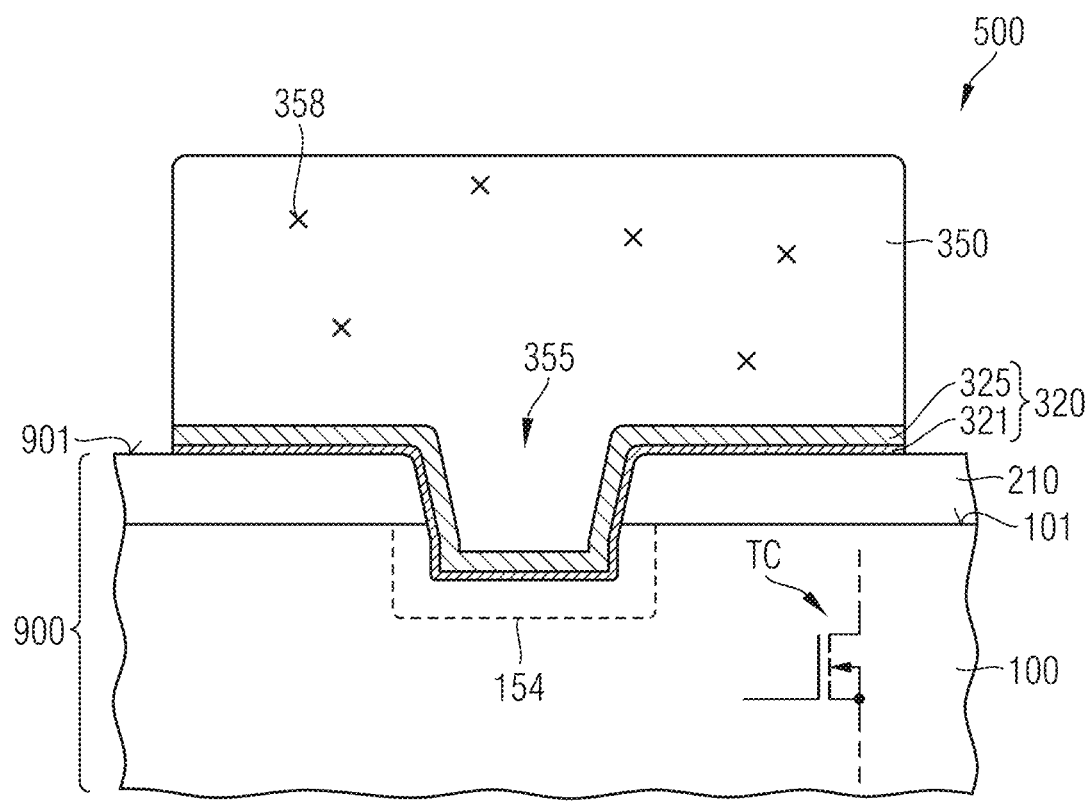
FIG. 2B is a schematic vertical cross-sectional view of a portion of a semiconductor device with an auxiliary layer stack between a metal structure and a conductive structure according to an embodiment with the conductive structure formed in a semiconductor portion covered by a dielectric passivation layer.
Figure 2C:
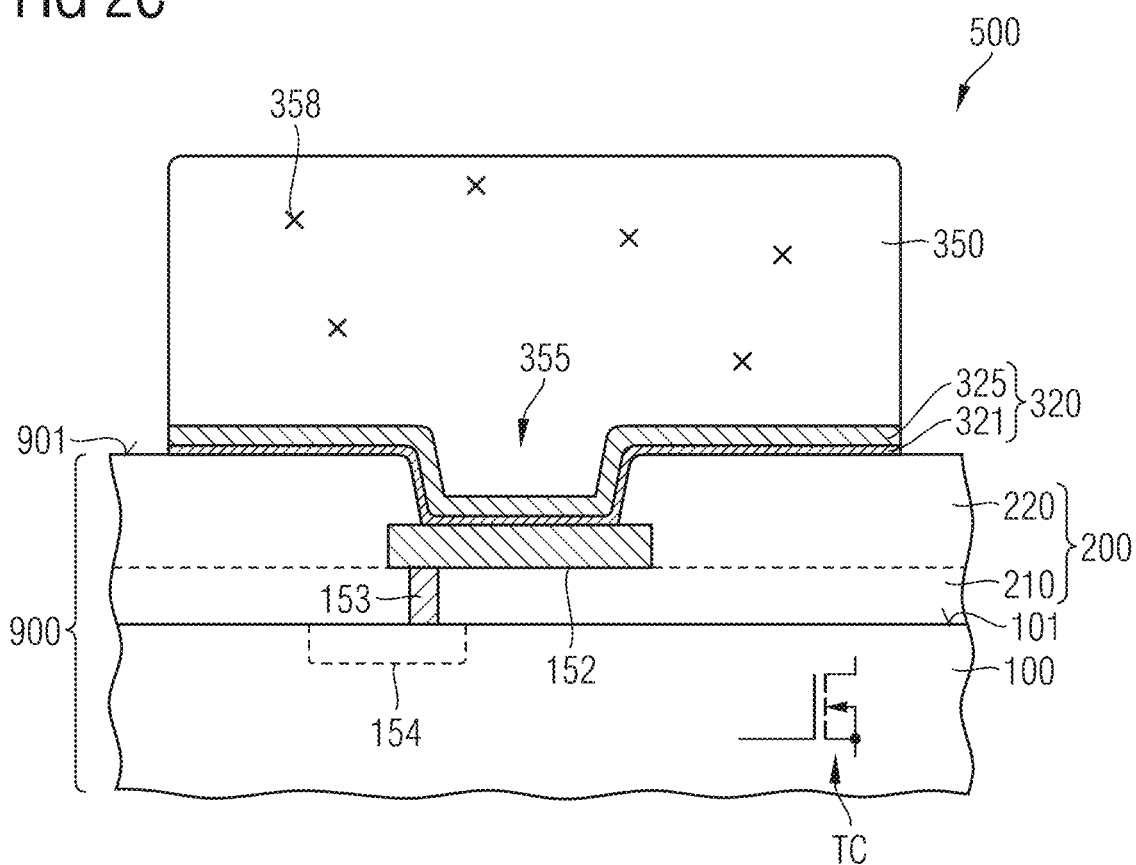
FIG. 2C is a schematic vertical cross-sectional view of a portion of a semiconductor device with an auxiliary layer stack between a metal structure and a conductive structure according to an embodiment with a wiring line forming the conductive structure.

FIG. 2C refers to a semiconductor device 500 with a semiconductor die 900 including a dielectric structure 210 formed on a first surface 101 of a semiconductor portion 100 with transistor cells TC as described with reference to FIG. 2B. The dielectric structure 210 separates a wiring line 152 from the semiconductor portion 100. A contact via 153 extends through an opening in the dielectric structure 210 and electrically connects the wiring line 152 with a doped region 154 in the semiconductor portion 100. An interlayer dielectric 220 covers the dielectric structure 210 and the wiring line 152. A metal structure 350 extends through an opening in the interlayer dielectric 220 and is electrically connected to the wiring line 152. An auxiliary layer stack 320 as described above may be sandwiched between the metal structure 350 and the wiring line 152.

Figure 2D:
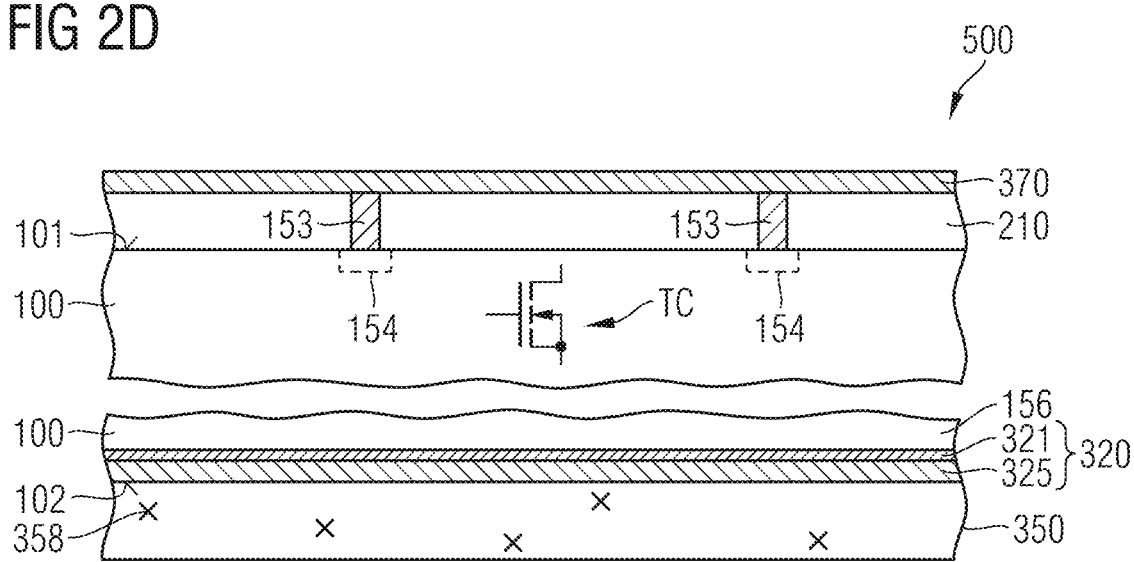
FIG. 2D is a schematic vertical cross-sectional view of a portion of a semiconductor device with an auxiliary layer stack between a metal structure and a conductive structure according to an embodiment with the conductive structure formed on the back of a semiconductor portion.

In FIG. 2D a semiconductor die 900 includes a plurality of transistor cells TC and a plurality of spatially separated doped regions 154, which are formed along or close to a first surface 101 of the semiconductor portion 100. Contact vias 153, which extend through a dielectric structure 210 may electrically connect a first load electrode 370 with the doped regions 154 at a front side of the semiconductor device 500.

On the back, a further doped region 156 may be formed along a second surface 102 of the semiconductor portion 100, wherein the second surface 102 is opposite to the first surface 101. An auxiliary layer stack 320 as described above and including at least a metal diffusion barrier layer 321 and an adhesion layer 325 is sandwiched between the second surface 102 and a metal structure 350 which is mainly based on a first metal and which may contain atoms 358 of a second metal, e.g., aluminum originating from the auxiliary layer stack 320.

Figure 2E:
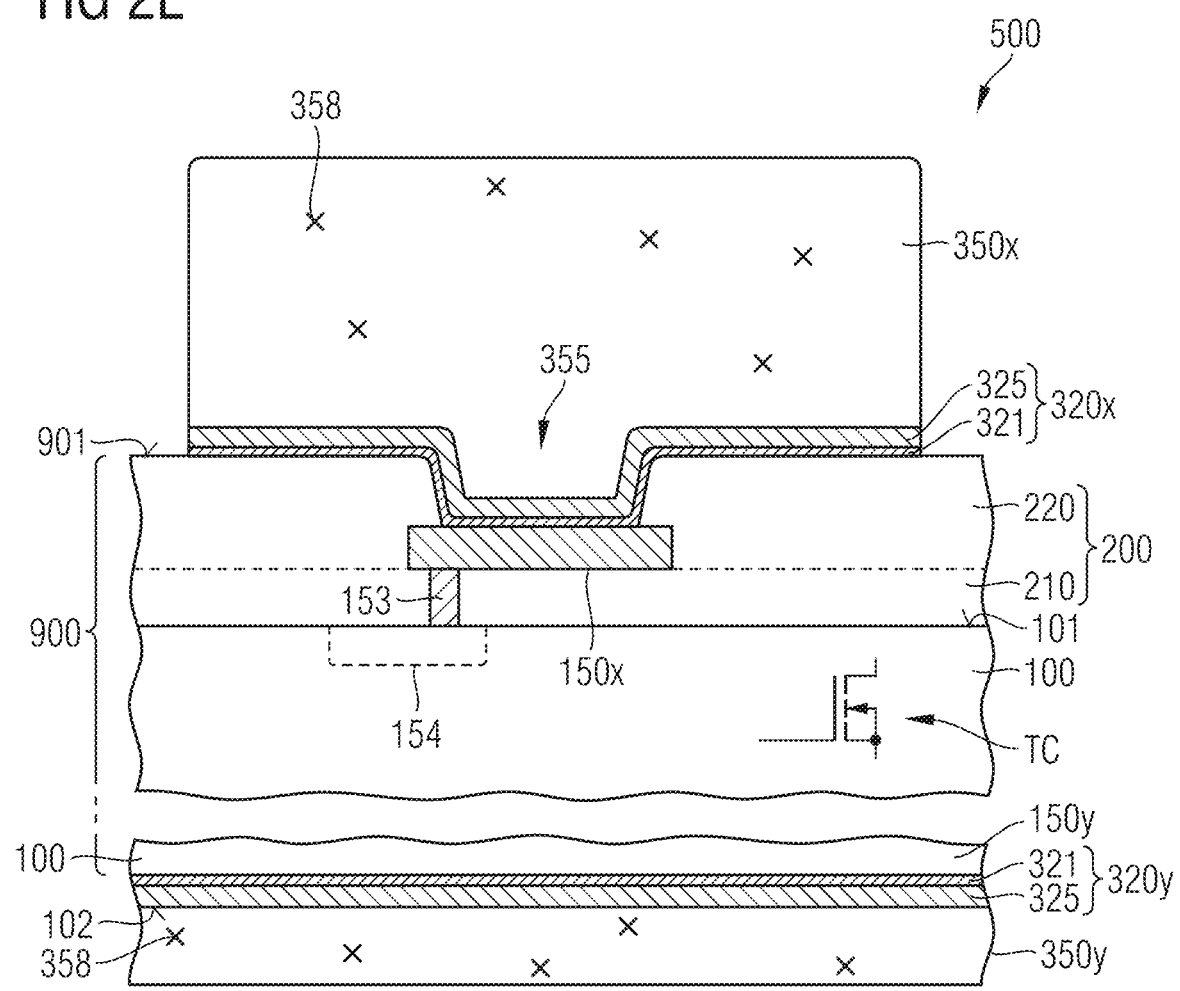
FIG. 2E is a schematic vertical cross-sectional view of a portion of a semiconductor device with auxiliary layer stacks between metal structures and conductive structures on opposite sides of a semiconductor die according to a further embodiment.

The semiconductor device 500 of FIG. 2E combines auxiliary layer stacks 320x, 320y for first and second metal structures 350x, 350y on opposite sides of a semiconductor die 900.

A first metal structure 350x is electrically connected to a first conductive structure 150x at a first side of the semiconductor die 900, wherein the first conductive structure 150x may be a doped region or a wiring line as illustrated. A second metal structure 350y is electrically connected to a second conductive structure 150y at a second side of the semiconductor die 900 opposite to the first side, wherein the second conductive structure 150y may be a doped region. A first auxiliary layer stack 320x is sandwiched between the first conductive structure 150x and the first metal structure 350x. A second auxiliary layer stack 320y is sandwiched between the second conductive structure 150y and the second metal structure 350y.

The first metal structure 350x may contain another first metal as the second metal structure 350y, e.g., the first metal structure 350x may contain copper or aluminum as main constituent, whereas the second metal structure 350y may contain, e.g., silver (Ag) as main constituent. According to an embodiment, the first and second metal structures 350x, 350y contain the same metal as main constituent.

The first and second auxiliary layer stacks 320x, 320y may have any of the configuration according to the embodiments, wherein the first and second auxiliary layer stacks 320x, 320y may have a same internal configuration and layer sequence or different configurations.

Figure 3A:
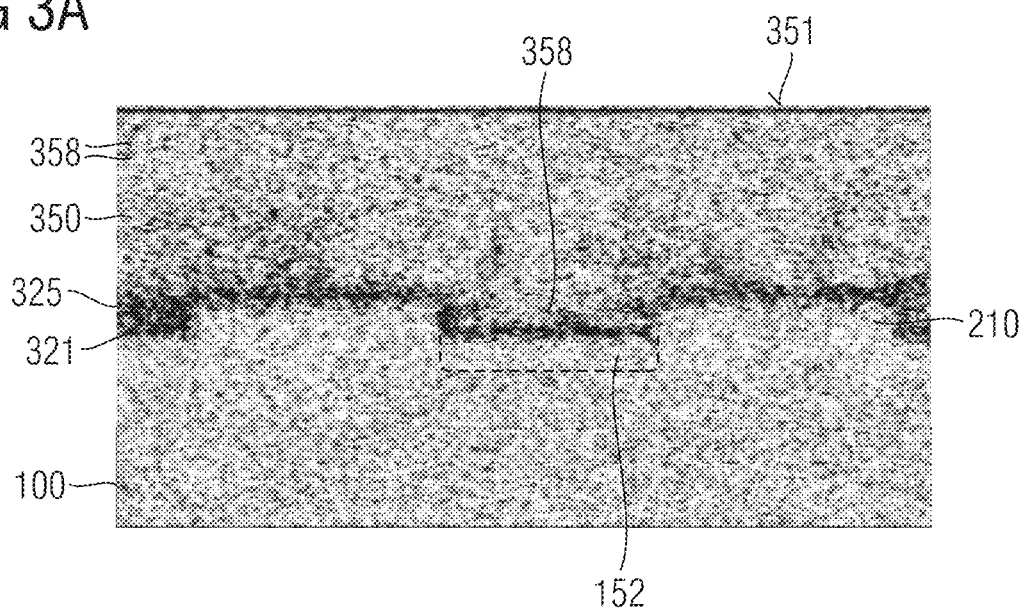
FIG. 3A is a schematic vertical cross-sectional view of a portion of a semiconductor device with an auxiliary layer stack sandwiched between a metal structure and a contact structure according to an embodiment with the metal structure including metal atoms of an adhesion layer.

FIG. 3A refers to embodiments with metal structures 350 containing diffused atoms 358 of the second metal and shows a distribution of atoms 358 of the second metal along a vertical cross-section through a semiconductor device 500 with a metal structure 350. Dark points correspond to detected atoms 358 of the second metal. The atoms 358 of the second metal occur at high density along both the interface to the metal diffusion barrier layer 321 and an exposed surface 351 of the metal structure 350.

The atoms 358 of the second metal accumulate along an interface with the metal diffusion barrier layer 321. Due to the high bonding energy with the material of the metal diffusion barrier layer 321, the atoms 358 of the second metal provide good adhesion to the metal diffusion barrier layer 321. Combined with the first metal of the metal structure 350, the atoms 358 of the second metal may form an adhesion layer 325 in which the atoms 358 of the second metal are solved in a matrix of the first atoms and/or in which the first and second metals form intermetallic phases, wherein in both cases the adhesion layer 325 reduces the proneness of the metal structure 350 for delamination.

In an embodiment with the first metal being copper and the second metal being aluminum, aluminum atoms may accumulate along the exposed surface 351 of the metal structure 350 and may prevent the metal structure 350 from being oxidized at the exposed surface 351 such that the metal structure 350 maintains good bonding and solder characteristics. Further the second metal may decorate cracks and/or grain boundaries in the metal structure 350. By locally forming intermetallic phases along cracks and/or grain boundaries, the second metal may increase device reliability by improving cohesion across the cracks and/or the grain boundaries.

Figure 3B:
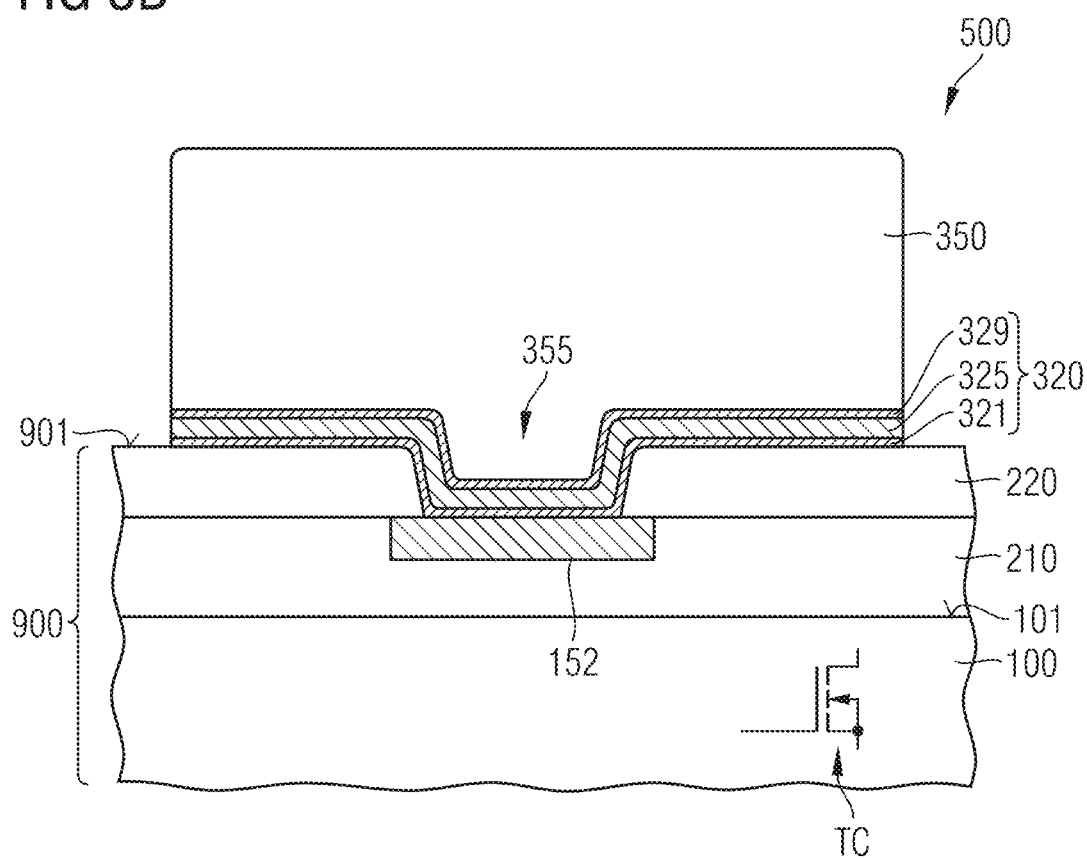
FIG. 3B is a schematic vertical cross-sectional view of a portion of a semiconductor device with an auxiliary layer stack sandwiched between a metal structure and a contact structure according to an embodiment with an auxiliary barrier layer between an adhesion layer and the metal structure.

In FIG. 3B the auxiliary layer stack 320 includes an auxiliary barrier layer 329 between an adhesion layer 325 and the metal structure 350. The auxiliary barrier layer 329 may be sandwiched between the adhesion layer 325 and the metal structure 350 and may directly adjoin to both of them as illustrated. According to another embodiment, at least one further layer may be between the adhesion layer 325 and the metal structure 350. The metal diffusion barrier layer 321 may be sandwiched between the adhesion layer 325 and the semiconductor die 900 as illustrated. According to another embodiment, at least one further layer may be between the adhesion layer 325 and the semiconductor die 900.

The adhesion layer 325 may contain, as main constituent, a second metal which is not the first metal of the metal structure 350. For example, the adhesion layer 325 is a layer consisting of one or more of Al, Sn, Zn, Ni, Pb, Au, Ag and Ti. According to an embodiment, the adhesion layer 325 contains Al as main constituent or may consist completely of Al. According to other embodiments the adhesion layer 325 may contain or consist of an alloy, which may be a solid solution or an intermetallic phase of the first and second metals, e.g., an alloy of copper (Cu) and aluminum (Al) or, e.g., a solid solution of aluminum (Al) in silver (Ag).

During manufacturing of the semiconductor device 500, the adhesion layer 325 may be formed by alloying a layer stack including a precursor adhesion layer containing the second metal and an alloy forming layer containing the first metal, wherein the alloy forming layer may be a layer similar to a seed layer for plating. The auxiliary barrier layer 329 prevents atoms of the second metal to diffuse into the metal structure 350 such that a metallic phase containing atoms of both the first and the second metal is formed exclusively between the metal diffusion barrier layer 321 and the auxiliary barrier layer 329. Both vertical extension and properties of the adhesion layer 325 are precisely defined. In addition the auxiliary barrier layer 329 prevents diffusion of atoms of the second metal into the metal structure 350 such that the high thermal conductivity of the metal structure 350 is fully maintained and is not deteriorated by any contamination with atoms of the second metal.

Figure 4A:
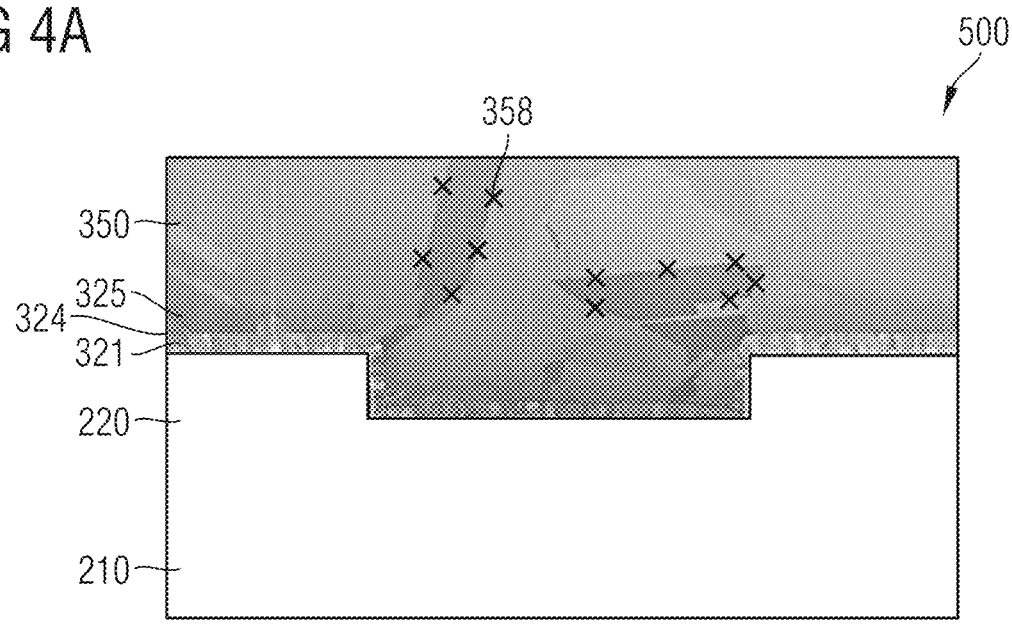
FIG. 4A is a FIB (focused ion beam) image of a cross-section of a portion of a semiconductor device according to an embodiment concerning an adhesion layer and a metal structure containing diffused metal atoms of the adhesion layer.

FIG. 4A is an FIB image of a cross-section of the interface of a metal structure 350 formed on a semiconductor die 900.

A metal diffusion barrier layer 321 containing, e.g., 90 wt % tungsten and 10 wt % titanium is sputtered on the semiconductor die 900. A thickness of the metal diffusion barrier layer 321 may be in a range from 50 nm to about 500 nm. An adhesion layer 325 covers the metal diffusion barrier layer 321. The adhesion layer 325 may be formed by depositing a precursor adhesion layer consisting of or containing a second metal on at least sections of the metal diffusion barrier layer 321 and depositing a precursor metal structure consisting of or containing a first metal on at least sections of the precursor adhesion layer. A thickness of the adhesion layer 325 may be in a range from 5 nm to about 500 nm.

A first heating treatment prior to the deposition of the precursor metal structure may form bonds between atoms of the second metal and constituents of the metal diffusion barrier layer 321. A second heating treatment after deposition of the precursor metal structure may diffuse atoms of the second metal from the precursor adhesion layer into adjoining portions of the precursor metal structure. The second heating treatment may or may not completely consume the precursor adhesion layer.

The second heating treatment forms an adhesion layer 325 in which the concentration of the second metal is at least 10% and which may include remnant sections of the precursor adhesion layer. On the left hand side of FIG. 4A remnants 324 of a precursor adhesion layer are visible as thin dark line directly on the metal diffusion barrier layer 321. The metal structure 350 is formed from a portion of the precursor structure in which the concentration of the second metal is lower than 10%.

The adhesion layer 325 is strongly bonded to both the metal diffusion barrier layer 321 and the metal structure 350 and reduces the risk for local delamination of the metal structure 350.

Figure 4B:
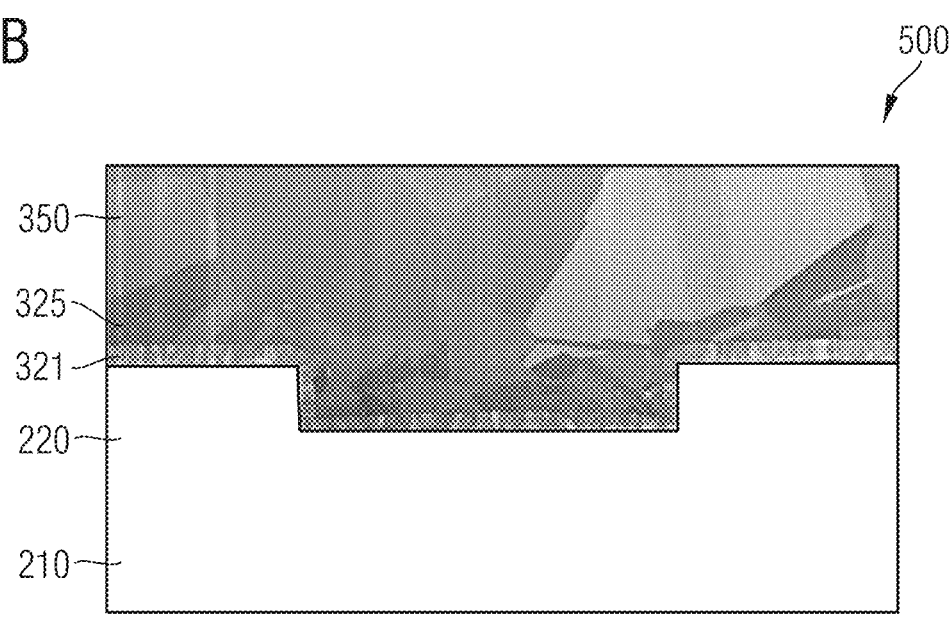
FIG. 4B is a FIB image of a cross-section of a portion of a semiconductor device according to an embodiment concerning an adhesion layer formed from an alloy of a first metal of the metal structure and a second metal.

In FIG. 4B at least a portion of a precursor metal structure or an alloy forming layer consisting of or containing the first metal is deposited onto the precursor adhesion layer prior to the first heating treatment. In addition to strong bonds between the atoms of the second metal and at least one constituent of the metal diffusion barrier layer 321, the first heating treatment forms a comparatively thick alloy layer of the first and second metals. The resulting alloy layer is effective as adhesion layer strongly bonding the metal structure 350 to the metal diffusion barrier layer 321.

According to an embodiment, the metal structure 350 contains copper as main constituent and the adhesion layer 325 consists of or contains a copper-aluminum alloy, wherein the aluminum content in the adhesion layer 325 may result in a Young's modulus of the adhesion layer 325 which is lower than Young's modulus of the metal structure 350. The increased ductability of the adhesion layer 325 may reduce thermo-mechanical stress occurring at the interface between the metal structure 350 and the metal diffusion barrier layer 321.

Figure 5:
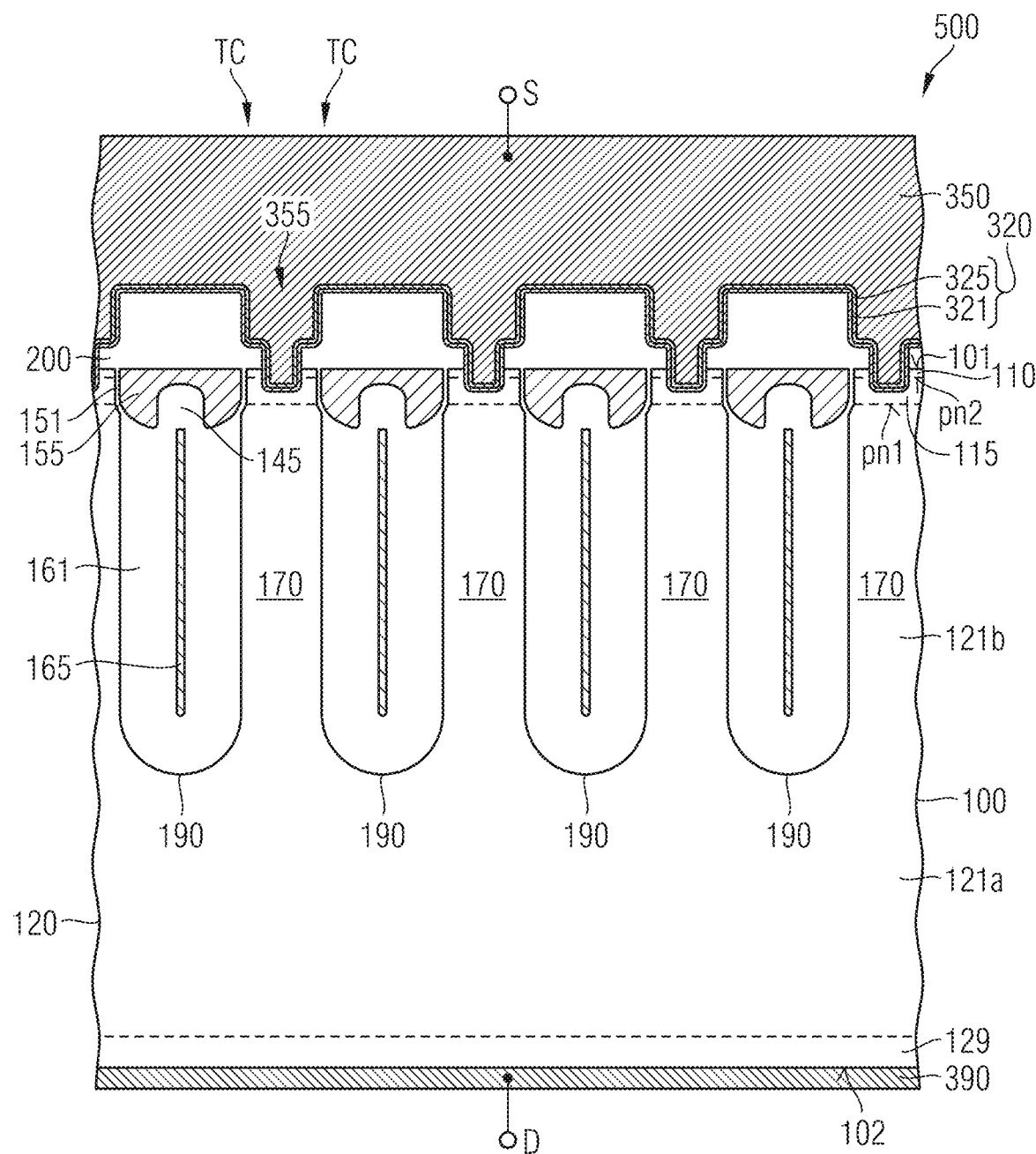
FIG. 5 is a schematic vertical cross-sectional view of a power semiconductor device with an auxiliary layer stack between a power metallization and a wiring layer according to a further embodiment.

FIG. 5 refers to IGFETs of the field plate type including a semiconductor portion 100 from a crystalline semiconductor material such as silicon. The first surface 101 on the front side of the semiconductor portion 100 is parallel to a planar second surface 102. A distance between the first and second surfaces 101, 102 is related to a voltage blocking capability of the semiconductor device 500 and may be at least 40 μm. According to other embodiments, the distance may be in the range of several hundred μm. In a plane perpendicular to the cross-sectional plane the semiconductor portion 100 may have a rectangular shape with an edge length of several millimeters.

The transistor cells TC are field effect transistor cells with insulated gate and control a load current flowing in a vertical direction between the first surface 101 and the second surface 102. Source zones no of the transistor cells TC may be electrically connected to a metal structure 350 forming a power metallization at the front side of the semiconductor device 500, wherein the metal structure 350 may form or may be electrically connected or coupled to a source terminal S. Drain zones of the transistor cells TC may be electrically connected to a further metal structure 390 on the back of the semiconductor device 500. The further metal structure 390 may form or may be electrically coupled or connected to a drain terminal D.

The semiconductor portion 100 includes a drain structure 120 including the drain zones of the transistor cells TC and electrically connected to the further metal structure 390. The drain structure 120 includes a drift zone 121, in which a dopant concentration may gradually or in steps increase or decrease with increasing distance to the first surface 101 at least in portions of its vertical extension. According to other embodiments, the dopant concentration in the drift zone 121 may be approximately uniform.

The drain structure 120 further includes a contact portion 129, which may be a heavily doped base substrate or a heavily doped layer. Along the second surface 102 a dopant concentration in the contact portion 129 is sufficiently high to form an ohmic contact with the further metal structure 390. The contact portion 129 may directly adjoin the drift zone 121. According to other embodiments, one or more further layers may be sandwiched between the drift zone 121 and the contact portion 129.

The drift zone 121 includes a continuous drift zone section 121a formed in a section of the semiconductor portion 100 between compensation structures 190 and the contact portion 129, wherein the compensation structures 190 extend from the first surface 101 into the semiconductor portion 100. Sections of the semiconductor portion 100 between the compensation structures 190 form semiconductor mesas 170 that include mesa sections 121b of the drift zone 121. The mesa sections 121b directly adjoin the continuous drift zone section 121a and form first pn junctions pn1 with body zones 115 that extend in the semiconductor mesas 170 between neighboring compensation structures 190. The body zones 115 form second pn junctions pn2 with the source zones no, which are sandwiched between the first surface 101 and the body zones 115.

In n-channel trench field plate FETs, the body zones 115 are p-doped and the source zones no as well as the drift zone 121 are n-doped. P-channel trench field plate FETs include n-doped body zones 115 and p-doped source zones no as well as a p-doped drift zone 121.

The compensation structures 190 may have approximately vertical sidewalls or may taper with increasing distance to the first surface 101. The compensation structures 190 may be stripes extending along a horizontal direction at a distance to each other or may be dot-shaped and arranged matrix-like in lines and rows.

The compensation structures 190 may include portions of a gate electrode 155 as well as portions of a gate dielectric 151 separating the gate electrode 155 from the body zones 115. The gate electrode 155 may be embedded in the compensation structure 190. According to other embodiments, portions of the gate electrode 155 are spaced from the compensation structures 190 by first mesa sections of the semiconductor mesas 170, wherein the first mesa sections include the source zones no as well as the body zones 115. The gate electrode 155 includes or consists of a heavily doped polycrystalline silicon material and/or a metal containing material and is electrically connected or coupled to a gate terminal.

The gate dielectric 151 may include a thermal portion resulting from a thermal oxidation and/or nitridation of the semiconductor material of the semiconductor portion 100 and/or one or more deposited dielectric layers. The gate dielectric 151 capacitively couples the gate electrode 155 to the body zones 115. In channel portions of the body zones 115 directly adjoining the gate dielectric 151 a potential applied to the gate terminal G may accumulate minority charge carriers to form conductive channels along the gate dielectric 151 between the source zones no and the drift zone 121 in an on-state of the transistor cell TC.

The compensation structures 190 further include a field electrode 165 and a field dielectric 161 that separates the field electrode 165 from the drift zone 121. The field electrode 165 includes a heavily doped polycrystalline silicon material and/or a metal containing material. An intermediate dielectric 145 may separate the field electrode 165 from the gate electrode 155. The field dielectric 161 may include a thermally grown portion and/or at least one deposited dielectric layer.

A dielectric structure 210 may separate the gate electrodes 155 from the metal structure 350. The dielectric structure 210 may include one or more dielectric layers from silicon oxide, silicon nitride, silicon oxynitride, doped or undoped silicate glass, for example BSG (boron silicate glass), PSG (phosphorus silicate glass) or BPSG (boron phosphorus silicate glass), by way of example.

Portions of the metal structure 350 form contact portions 355 that extend through openings in the dielectric structure 210 and that electrically connect the metal structure 350 with the source zones no and with the body zones 115 of the transistor cells TC. An auxiliary layer stack 320 including at least a metal diffusion barrier layer 321 and an adhesion layer 325 as described above separates the metal structure 350 from the semiconductor portion 100 and from the dielectric structure 210.

FIGS. 6A to 6E refer to a method of manufacturing a semiconductor device with a metal structure connected to a conductive structure through an auxiliary layer stack.

Figure 6A:
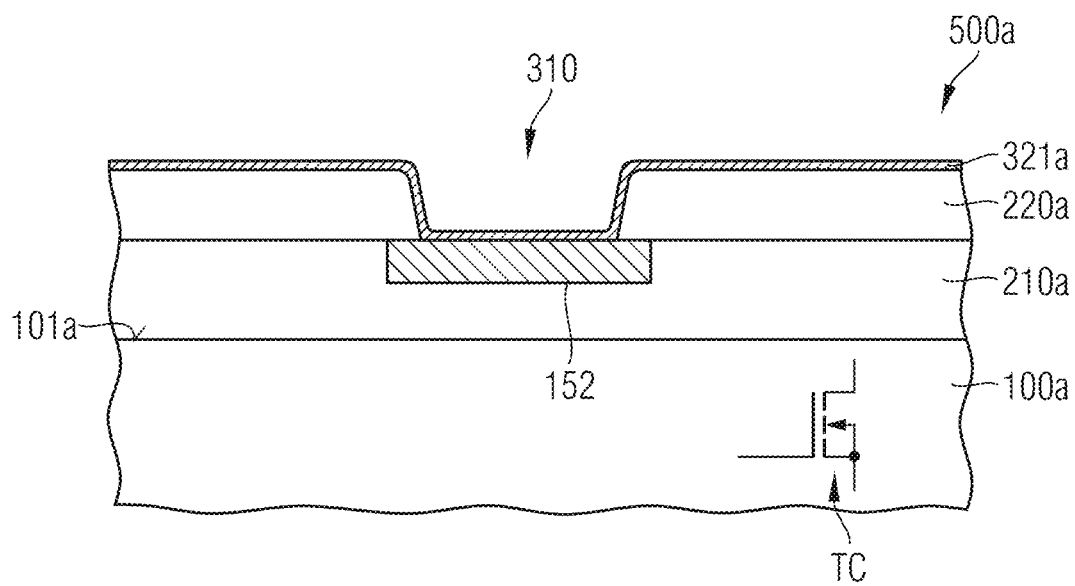
FIG. 6A is a schematic vertical cross-sectional view of a portion of a semiconductor substrate for illustrating a method of manufacturing a semiconductor device with an adhesion layer according to an embodiment concerning an adhesion layer formed from an alloy, after depositing a metal diffusion barrier layer.

FIG. 6A shows a semiconductor substrate 100a consisting of or containing a semiconductor layer bow of a single-crystalline semiconductor material. The semiconductor substrate 500a may be a semiconductor wafer from which a plurality of identical semiconductor dies is obtained. The semiconductor material of the semiconductor layer 100a may be silicon (Si), silicon carbide (SiC), germanium (Ge), a silicon germanium crystal (SiGe), gallium nitride (GaN) or gallium arsenide (GaAs) or any other $A_{III}B_{IV}$ semiconductor, by way of example.

A perpendicular to a process surface 101a of the semiconductor layer 100a defines a vertical direction and directions orthogonal to the vertical direction are horizontal directions.

The semiconductor layer bow includes semiconducting portions of at least one electronic element. For example, a semiconductor diode and/or a plurality of transistor cells TC are formed in the semiconductor layer 100a.

A first dielectric layer 210a may be formed on the process surface 101a of the semiconductor layer 100a. The first dielectric layer 210a may include or consist of a thermally grown dielectric layer, one or more deposited layers, or a combination of thermally grown dielectric layers and deposited dielectric layers such as thermally grown silicon oxide, silicon nitride, silicon oxynitride, silicate glass, e.g., BSG, PSG, BPSG, FSG, or OSG, SOG or a dielectric resin. A wiring line 152 may be formed on the first dielectric layer 210a. The wiring line may be formed from a metal layer, e.g. a layer containing aluminum, copper and/or tungsten. A second dielectric layer 220a may be deposited onto the first wiring line 152 and the first dielectric layer 210a and may be patterned by photolithography to form, in the second dielectric layer 220a, a contact trench 310 that exposes a section of the wiring line 152. A precursor barrier layer 321a may be deposited that lines the contact trench 310 and that covers remnant sections of the second dielectric layer 220a.

FIG. 6A shows the precursor barrier layer 321a from a metal diffusion resistant material consisting of or containing at least one of titanium, titanium nitride, tantalum, tantalum nitride, tungsten, and molybdenum. According to an embodiment, the precursor barrier layer 321a is a sputtered layer containing tungsten and titanium, e.g., at about 90 wt % tungsten and about 10 wt % titanium. A layer thickness of the precursor barrier layer 321a may be in a range from 50 nm to 500 nm.

A precursor adhesion layer 324a containing or consisting of a second metal is deposited on the precursor barrier layer 321a and an alloy forming layer 326a containing or consisting of a first metal is deposited on the precursor adhesion layer 324a. Deposition of the precursor barrier layer 321a, the precursor adhesion layer 324a and the alloy forming layer 326a may be performed without that the semiconductor substrate 500a is exposed to an ambient containing reactive gases such as oxygen, e.g., in subsequent processes at the same deposition vacuum tool or in the same deposition vacuum chamber.

Figure 6B:
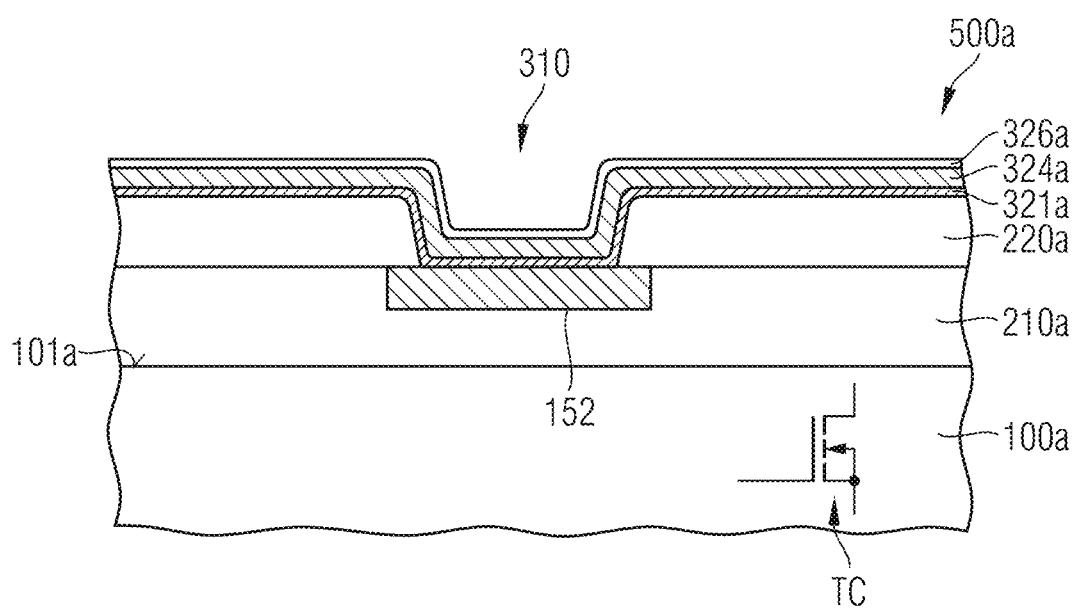
FIG. 6B is a schematic vertical cross-sectional view of the semiconductor substrate portion of FIG. 6A, after forming an alloy forming layer and a precursor adhesion layer on the metal diffusion barrier layer.

FIG. 6B shows the precursor adhesion layer 324a between the alloy forming layer 326a and the precursor barrier layer 321a. According to an embodiment, further layers may be deposited between the precursor barrier layer 321a, the precursor adhesion layer 324a and the alloy forming layer 326a. In the illustrated embodiment, the precursor adhesion layer 324a is sandwiched between the alloy forming layer 326a and the precursor barrier layer 321a. A thickness of the precursor adhesion layer 324a may be in a range from 5 nm to 500 nm, for example in a range from 10 nm to 100 nm. A thickness of the alloy forming layer 326a may be in a range from 5 nm to 500 nm, for example in a range from 10 nm to 100 nm.

The semiconductor substrate 500a is subjected to a heating treatment at a temperature in a range from 300° C. to 450° C., for example in a range from 350° to 450° C. The heating treatment may be performed without exposing the semiconductor substrate 500a to an oxygen-containing atmosphere between deposition of the alloy forming layer 326a and the heating treatment, e.g., successively at the same tool or in the same process chamber used for depositing the precursor barrier layer 321a, the precursor adhesion layer 324a and the alloy forming layer 326a.

The heating treatment generates bonds between constituents of the precursor adhesion layer 324a and the precursor barrier layer 321a. Further, the precursor adhesion layer 324a and the alloy forming layer 326a form an intermetallic phase or alloy. A plating mask layer may be deposited and patterned by photolithography to form a plating mask 410.

Figure 6C:
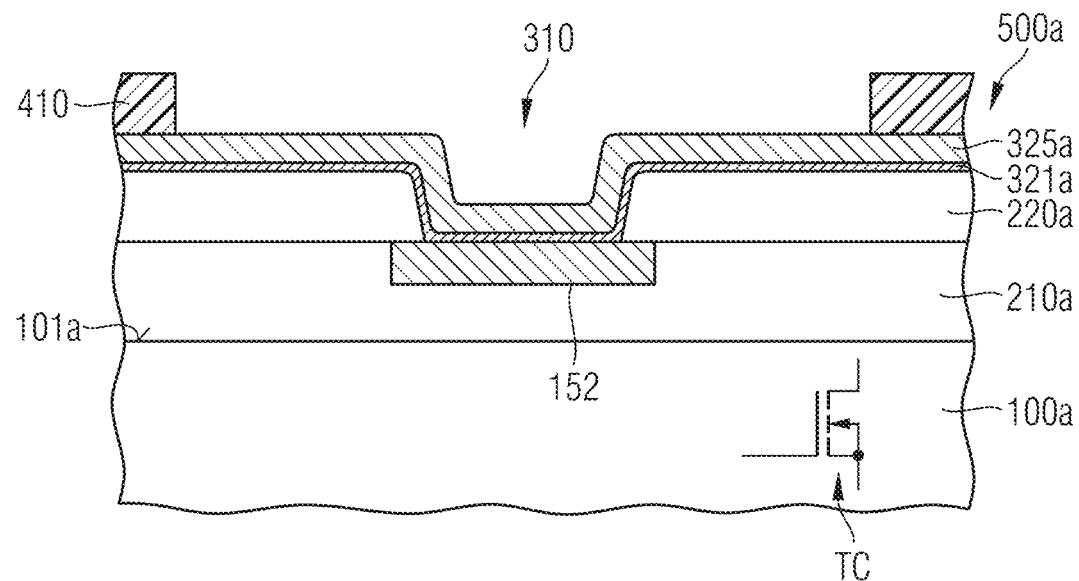
FIG. 6C shows the semiconductor substrate portion of FIG. 6B, after forming a plating mask on an adhesion layer formed by alloying the precursor adhesion layer and the alloy forming layer.

FIG. 6C shows an adhesive layer 325a formed by the heating treatment from the alloy forming layer 326a and the precursor adhesion layer 324a of FIG. 6B. According to an embodiment referring to a precursor adhesion layer 324a from aluminum and an alloy forming layer 326a from copper, the adhesive layer 325a is or contains an AlCu alloy. The plating mask 410 exposes first sections of the adhesive layer 325a including and around the contact trench 310 and covers second sections of the adhesive layer 325a.

The first metal is deposited by electroplating in a thickness corresponding to a vertical extension of the final metal structure, wherein the first metal selectively deposits in the first sections of the adhesive layer 325a exposed by the plating mask 410.

The plating mask 410 may be removed and sections of the adhesive layer 325a and the precursor barrier layer 321a exposed by removal of the plating mask 410 may be removed. The semiconductor substrate 500a may be subjected to a further heating treatment at a temperature of at least 400° C. such that atoms 358 of the second metal may diffuse out into the first metal to form a metal structure 350 based on the first metal and containing atoms 358 of the second metal.

Figure 6D:
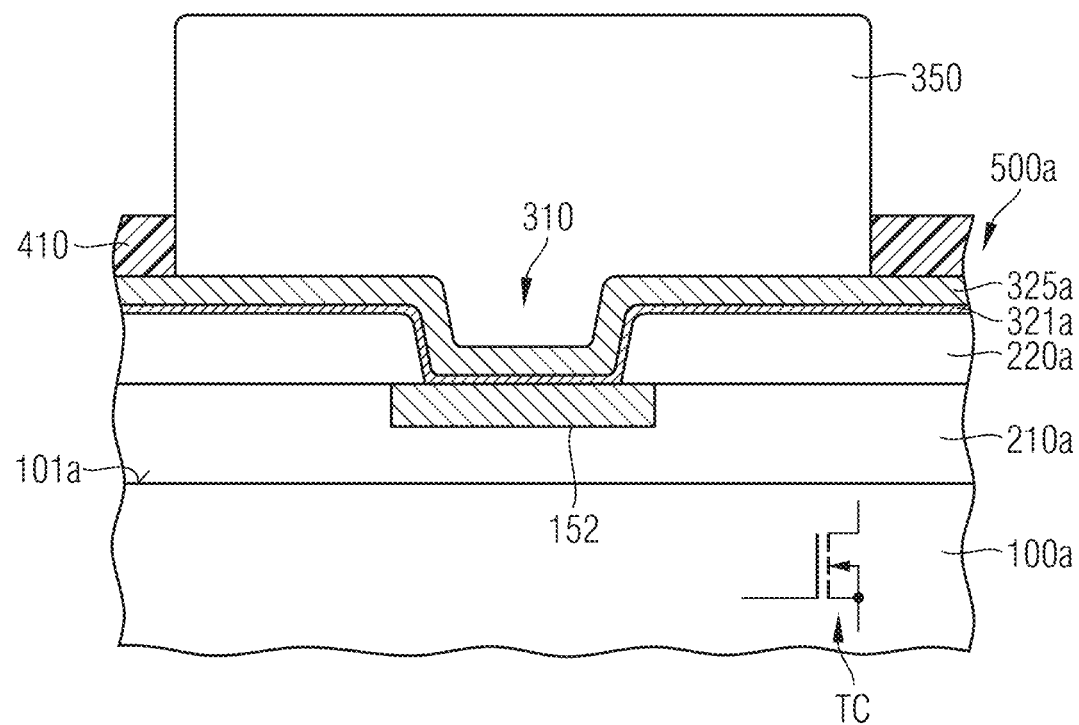
FIG. 6D is a schematic cross-sectional view of the semiconductor substrate portion of FIG. 6C, after forming the metal structure by electrochemical metal pattern plating.
Figure 6E:
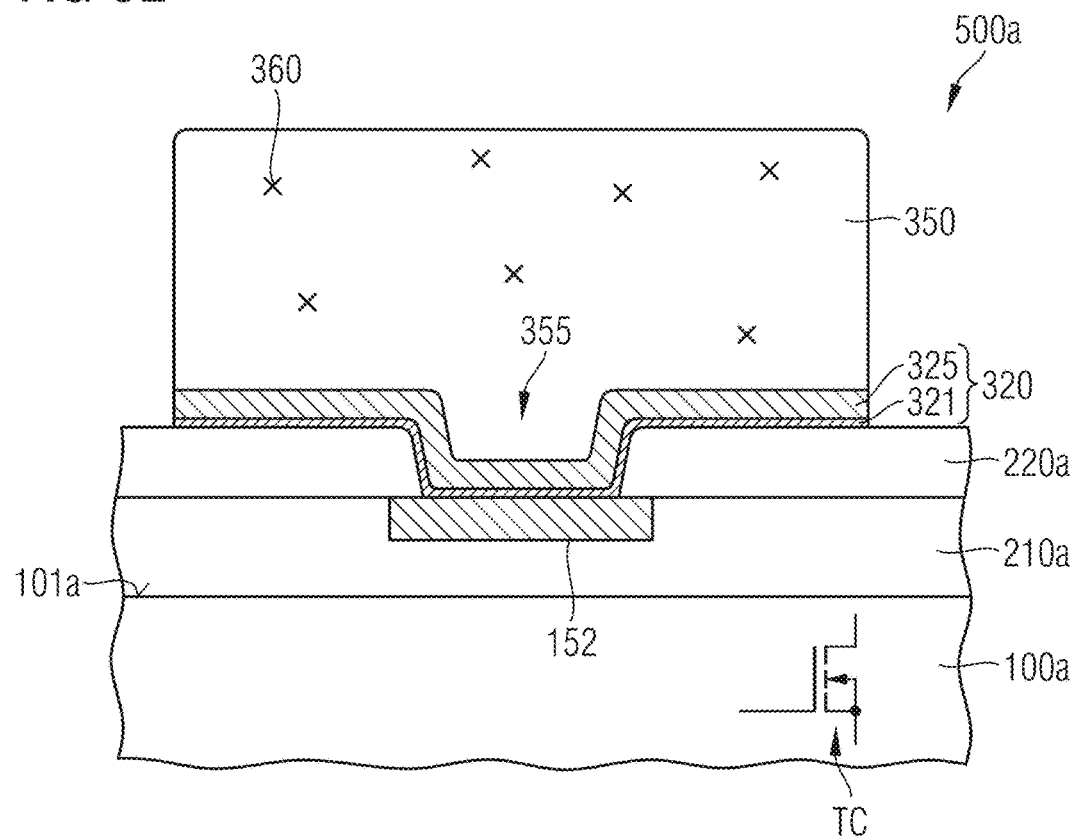
FIG. 6E is a schematic cross-sectional view of the semiconductor substrate portion of FIG. 6D, after a heating treatment diffusing metal atoms contained in the adhesion layer into the metal structure.

FIG. 6E shows an auxiliary layer stack 320 including at least the patterned adhesion layer 325 and the patterned metal diffusion barrier layer 321 sandwiched between the metal structure 350 and the second dielectric layer 220a as well as between the metal structure 350 and the wiring line 152. The metal structure 350 includes atoms 358 of the second metal.

Instead of between the wiring line 152 and the metal structure 350, the auxiliary layer stack 320 may be formed between the metal structure 350 and a doped region in the semiconductor layer bow as well.

Figure 7A:
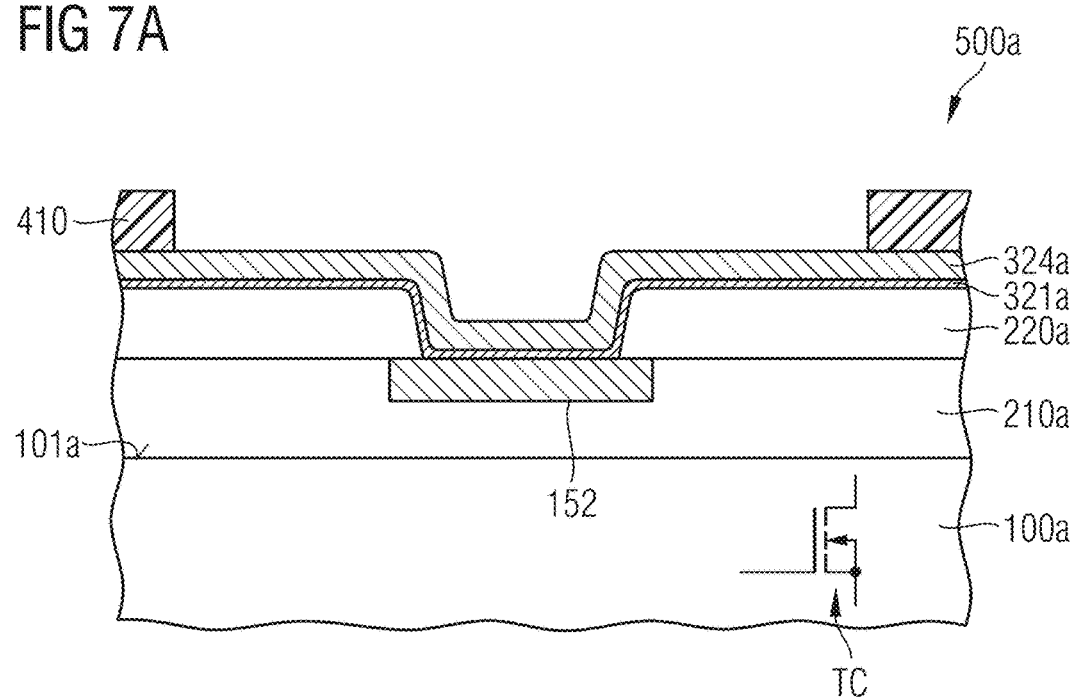
FIG. 7A is a schematic vertical cross-sectional view of a portion of a semiconductor substrate for illustrating a method of manufacturing a semiconductor device with an adhesion layer according to an embodiment with atoms of a precursor adhesion layer diffused into the metal structure, after forming a plating mask.
Figure 7B:
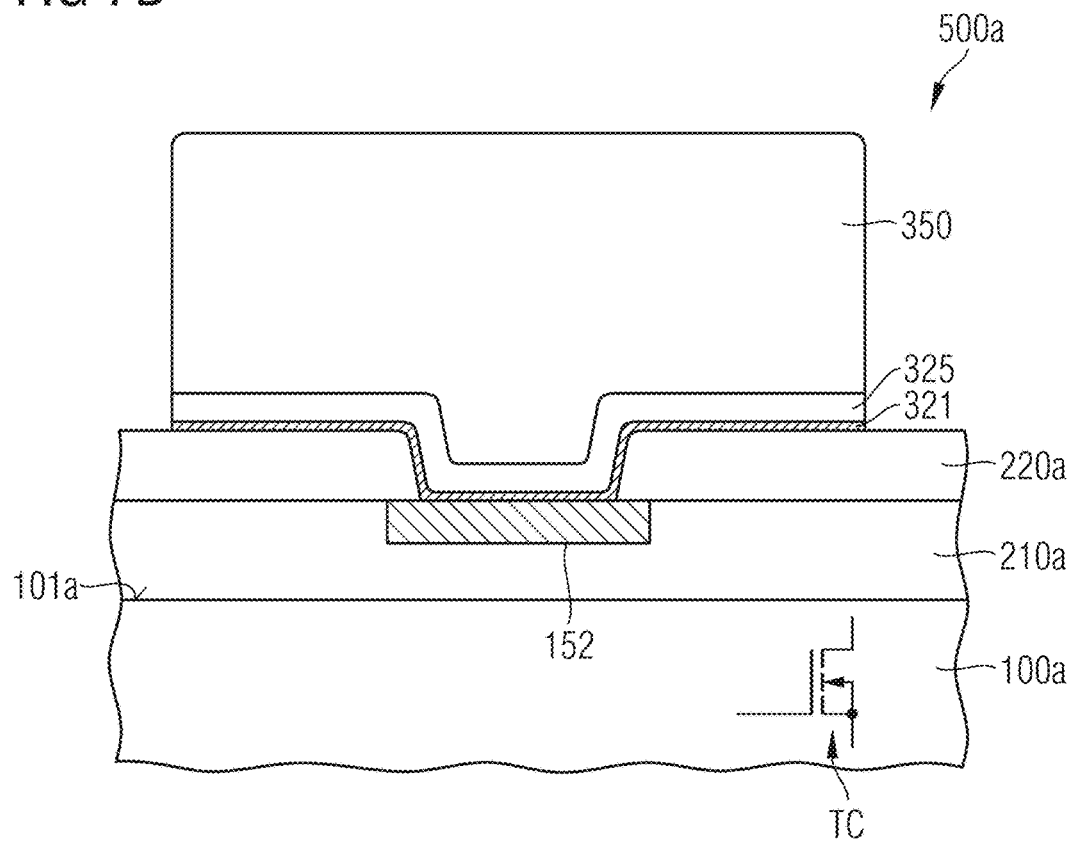
FIG. 7B is a schematic vertical cross-sectional view of the semiconductor substrate portion of FIG. 7A, after diffusing atoms of the precursor adhesion layer into a metal structure formed by electrochemical metal pattern plating.

FIGS. 7A to 7B refer to a method without a dedicated alloy forming layer.

A precursor barrier layer 321a is formed as described with reference to FIG. 6A. A thin precursor adhesion layer 324a is formed on the precursor barrier layer 321a as described with reference to FIG. 6B. A plating mask 410 may be formed on the precursor adhesion layer 324a.

FIG. 7A shows the thin precursor adhesion layer 324a with a thickness of at most 20 nm, e.g., at most 10 nm. The plating mask 410 directly adjoins the precursor adhesion layer 324a.

The first metal may be electroplated as described with reference to FIG. 6D in a thickness corresponding to a vertical extension of the final metal structure. A heating treatment at a temperature between 350° C. and 450° C. may form bonds between the second metal and at least one constituent of the precursor barrier layer 321a and forms an adhesion layer by alloying the precursor adhesion layer 324a with the first metal. The plating mask 410 may be removed and sections of the adhesive layer 325a and the precursor barrier layer 321a exposed by removal of the plating mask 410 may be removed.

FIG. 7B shows the patterned adhesion layer 325 from an intermetallic phase of the first and second metals. With the comparatively thin precursor adhesion layer 324a, the resulting alloy layer has only a small vertical extension and in the metal structure 350 the overall content of atoms of the second metal is low. In case the metal structure 350 is mainly based on copper, the second metal adversely affects the superior electrical and thermal conductivity as well as thermal capacity of copper only to a low degree.

Figure 8A:
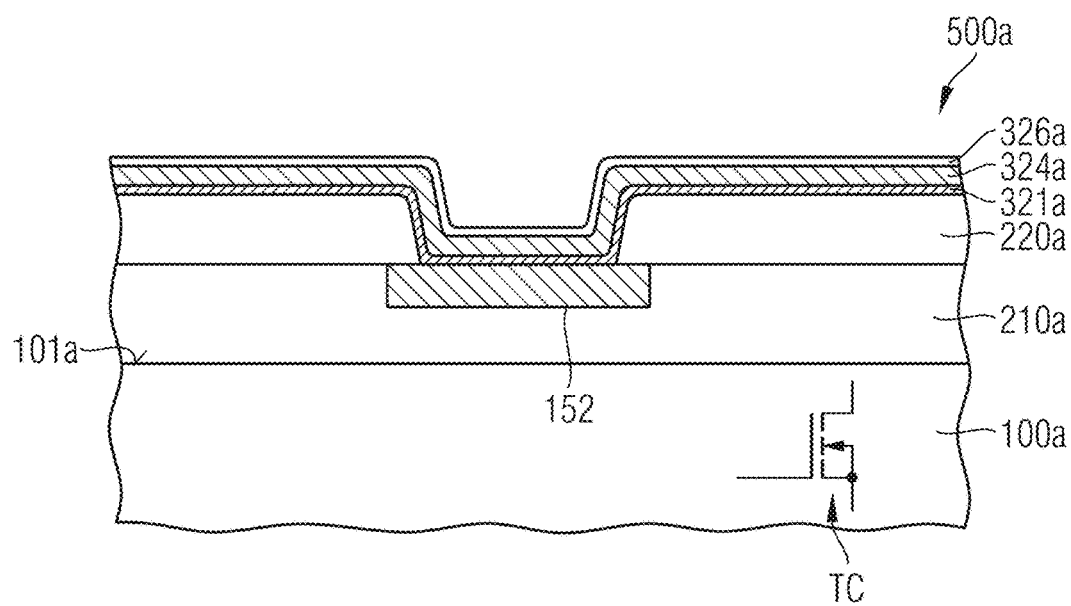
FIG. 8A is a schematic vertical cross-sectional view of a portion of a semiconductor substrate for illustrating a method of manufacturing a semiconductor device with an adhesion layer according to an embodiment concerning an auxiliary barrier layer between the metal structure and an adhesion layer, after depositing an alloy forming layer and a precursor adhesion layer.
Figure 8B:
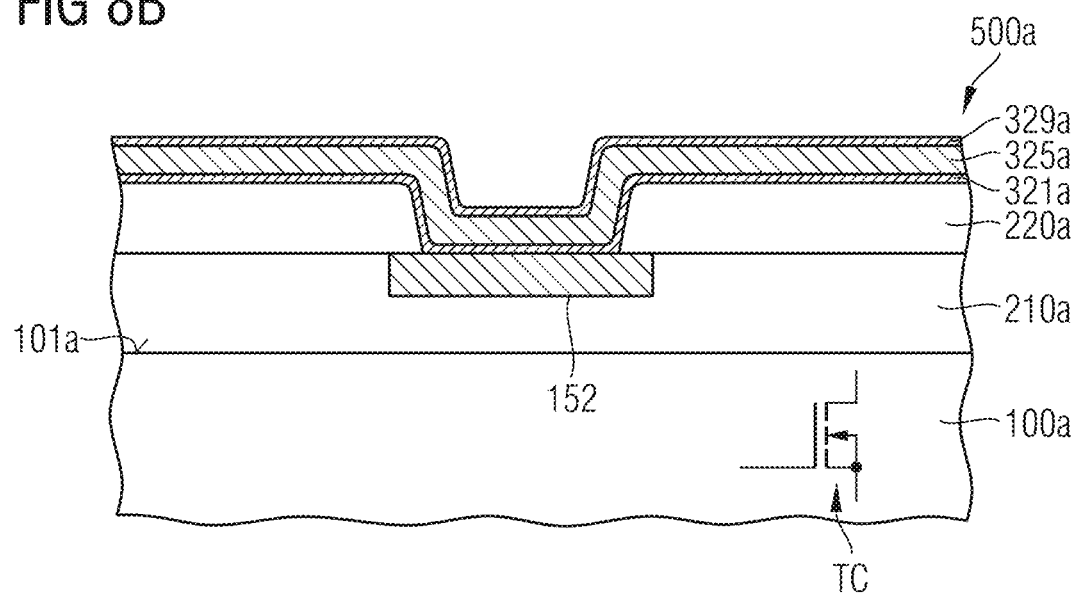
FIG. 8B is a schematic vertical cross-sectional view of the semiconductor substrate portion of FIG. 8A, after depositing an auxiliary barrier layer on an adhesion layer formed from the precursor adhesion layer and the alloy forming layer.
Figure 8C:
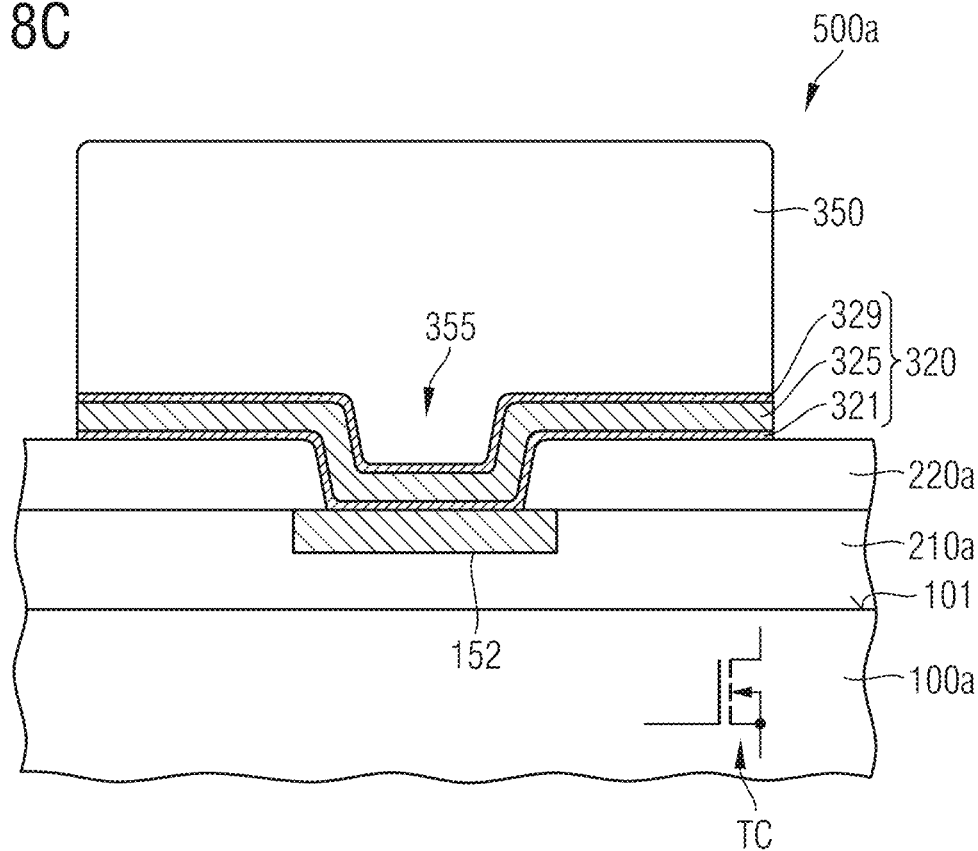
FIG. 8C is a schematic cross-sectional view of the semiconductor substrate portion of FIG. 8B, after forming the metal structure by electrochemical metal pattern plating.

FIGS. 8A to 8C refer to a manufacturing method concerning an additional barrier layer.

A precursor barrier layer 321a is formed as described with reference to FIG. 6A. A precursor adhesion layer 324a is formed on the precursor barrier layer 321a and an alloy forming layer 326a is formed on the precursor adhesion layer 324a as described with reference to FIG. 6B. The sequence of deposition of the alloy forming layer 326a and the precursor adhesion layer 324a may be changed such that the alloy forming layer 326a is formed on the precursor barrier layer 321a and the precursor adhesion layer 324a is formed on the alloy forming layer 326a.

FIG. 8A corresponds to FIG. 6B and shows the alloy forming layer 326a and the precursor adhesion layer 324a formed on the precursor barrier layer 321a.

An additional barrier layer 329a is formed on the alloy forming layer 326a or, if the alloy forming layer 326a is formed prior to the precursor adhesion layer 324a, on the precursor adhesion layer 324a. From the alloy forming layer 326a and the precursor adhesion layer 324a, a heating treatment forms an adhesive layer 325a of an alloy of the first and second metals. The heating treatment at a temperature between 350° C. and 450° C. may be performed prior to or in-situ after the formation of an additional barrier layer 329a.

FIG. 8B shows the adhesive layer 325a sandwiched between the precursor barrier layer 321a and the additional barrier layer 329a.

A metal structure 350 may be electroplated as described with reference to FIG. 6D.

Since the additional barrier layer 329a blocks any outdiffusion of atoms of the second metal, the metal structure 350 illustrated in FIG. 8C is devoid of any contaminations deteriorating the superior electrical and thermal conductivity as well as the thermal capacity of copper. Formation of the intermetallic phase only takes place between the precursor barrier layer 321a and the additional barrier layer 329a. According to another embodiment, deposition of the alloy forming layer may be omitted and a layer containing or consisting of the second metal but not containing the first metal is between the patterned metal diffusion barrier layer 321 and the patterned auxiliary barrier layer 329.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
   forming a semiconductor substrate comprising a conductive structure;
   forming a precursor auxiliary layer stack on a first section of the conductive structure, the precursor auxiliary layer stack comprising a precursor adhesion layer and a precursor barrier layer between the precursor adhesion layer and the conductive structure, wherein the precursor adhesion layer contains a second metal; and
   forming, on the precursor auxiliary layer stack, a metal structure containing a first metal and forming, from portions of the precursor auxiliary layer stack an adhesive layer containing the first and second metals, the second metal being different from the first metal.

2. The method of claim 1, wherein forming the precursor auxiliary layer stack further comprises depositing an alloy forming layer containing the second metal.

3. The method of claim 1, further comprising heating the semiconductor substrate to a temperature at which an intermetallic phase containing the first and second metals is formed in the adhesive layer.

4. The method of claim 1, wherein the auxiliary layer stack is formed by successive processes in a same process chamber without exposing the semiconductor substrate to oxygen.

5. The method of claim 1, wherein the metal structure is formed by electroplating the first metal.

6. The method of claim 1, further comprising exposing the semiconductor substrate to a laser treatment to form, in the adhesive layer, an intermetallic phase containing the first and second metals.

7. The method of claim 1, further comprising heating the semiconductor substrate to a temperature at which an intermetallic phase is formed that contains the second metal and at least one constituent of the precursor barrier layer.

8. The method of claim 1, further comprising forming, before electroplating, a plating mask exposing first sections of the precursor auxiliary layer stack and covering second sections of the precursor auxiliary layer stack, and removing, after electroplating, the plating mask and portions of the auxiliary layer stack exposed by removing the plating mask.

9. The method of claim 1, further comprising forming, prior to forming the precursor auxiliary layer stack, a dielectric passivation layer, wherein an opening in the dielectric passivation layer exposes the first section of the conductive structure.

10. A method of manufacturing a semiconductor device, the method comprising:
    forming a plurality of source regions at a first major surface of a semiconductor die comprising the first major surface and an opposite second major surface;
    forming a plurality of gate electrodes at the first major surface, each of the plurality of gate electrodes being proximate with two other source regions of the plurality of source regions;
    forming a common drain region at the second major surface;
    forming a common auxiliary layer stack over the first major surface, the common auxiliary layer stack directly contacting each of the plurality of source regions, wherein forming the common auxiliary layer stack comprises:
    forming a metal diffusion barrier layer, and
    forming an adhesion layer over the metal diffusion barrier layer, wherein the adhesion layer comprises a first metal and a second metal different from the first metal; and
    forming a common metal structure over the common auxiliary layer stack, the common metal structure comprising the first metal, wherein the common metal structure directly contacts the adhesion layer.

11. The method of claim 10, wherein forming the common auxiliary layer stack further comprises heating the semiconductor substrate to a temperature at which an intermetallic phase containing the first and second metals is formed in the adhesive layer.

12. The method of claim 10, further comprising forming a dielectric passivation layer between the common metal structure and each of the plurality of gate electrodes.

13. The method of claim 10, wherein the metal diffusion barrier layer comprises tungsten, titanium, or tantalum.

14. The method of claim 10, wherein the first metal is copper or silver, and wherein the second metal is one of aluminum, tin, zinc, gold, silver, lead, nickel, and titanium.

15. A method of manufacturing a semiconductor device, the method comprising:
    forming a source region at a first major surface of a semiconductor substrate comprising the first major surface and an opposite second major surface;
    forming a trench extending into the semiconductor substrate from the first major surface, wherein a first mesa and a second mesa are formed around the trench;
    forming a gate electrode in the trench;
    forming an auxiliary layer stack over the first major surface, the auxiliary layer stack directly contacting the source region, the auxiliary layer stack comprising a barrier layer and an adhesion layer disposed over the barrier layer, the adhesion layer comprising a first metal and a second metal different from the first metal;

forming a metal structure, directly contacting the adhesion layer, over the auxiliary layer stack, the metal structure comprising the first metal; and forming a drain region at the second major surface.

16. The method of claim 15, wherein a main constituent of the metal structure is the first metal and wherein a main constituent of the adhesion layer is the second metal.

17. The method of claim 15, wherein the barrier layer comprises tungsten, titanium, or tantalum.

18. The method of claim 15, wherein the first metal is copper or silver.

19. The method of claim 15, wherein the second metal is one of aluminum, tin, zinc, gold, silver, lead, nickel, and titanium.

20. The method of claim 15, wherein the metal structure further comprises the second metal.

* * * * *